(12) United States Patent
Chen et al.

(10) Patent No.: US 9,082,723 B2
(45) Date of Patent: Jul. 14, 2015

(54) SEMICONDUCTOR PACKAGE AND FABRICATION METHOD THEREOF

(71) Applicant: Siliconware Precision Industries Co., Ltd, Taichung (TW)

(72) Inventors: Tzu-Chieh Chen, Taichung (TW); Shih-Chao Chiu, Taichung (TW); Chia-Cheng Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/143,700

(22) Filed: Dec. 30, 2013

(65) Prior Publication Data

US 2015/0155250 A1 Jun. 4, 2015

(30) Foreign Application Priority Data

Nov. 29, 2013 (TW) .............................. 102143688 U

(51) Int. Cl.
*H01L 23/00* (2006.01)
*H01L 21/768* (2006.01)
*H01L 23/522* (2006.01)

(52) U.S. Cl.
CPC .............. *H01L 24/32* (2013.01); *H01L 21/768* (2013.01); *H01L 23/5226* (2013.01); *H01L 24/27* (2013.01)

(58) Field of Classification Search
CPC ....... H01L 24/32; H01L 24/27; H01L 21/768; H01L 23/5226
USPC .................................................. 438/107, 110
See application file for complete search history.

(56) References Cited

U.S. PATENT DOCUMENTS

| 6,281,450 | B1 * | 8/2001 | Urasaki et al. ................ 174/261 |
| 6,285,075 | B1 * | 9/2001 | Combs et al. ................. 257/675 |
| 7,842,541 | B1 * | 11/2010 | Rusli et al. .................... 438/106 |
| 7,842,887 | B2 * | 11/2010 | Sakamoto et al. ............ 174/260 |

* cited by examiner

*Primary Examiner* — Roy Potter
*Assistant Examiner* — Paul Patton
(74) *Attorney, Agent, or Firm* — Mintz Levin Cohn Ferris Glovsky and Popeo, P.C.; Peter F. Corless; Steven M. Jensen

(57) ABSTRACT

A semiconductor package is provided, which includes: a first dielectric layer having opposite first and second surfaces and a cavity penetrating the first and second surfaces; a first circuit layer embedded in the first dielectric layer and exposed from the first surface of the first dielectric layer; at least an adhesive member formed in the cavity and adjacent to the first surface of the first dielectric layer; an electronic element disposed on the adhesive member; a second dielectric layer formed on the second surface of the first dielectric layer and in the cavity to encapsulate the adhesive member and the electronic element; a second circuit layer formed on the second dielectric layer; and a plurality of conductive vias formed in the second dielectric layer for electrically connecting the second circuit layer and the electronic element, thereby reducing the package size and cost and increasing the wiring space and flexibility.

19 Claims, 4 Drawing Sheets

SEMICONDUCTOR PACKAGE AND FABRICATION METHOD THEREOF

CROSS-REFERENCES TO RELATED APPLICATIONS

This application claims under 35 U.S.C. §119(a) the benefit of Taiwanese Application No. 102143688, filed Nov. 29, 2013, the entire contents of which is incorporated herein by reference.

BACKGROUND OF THE INVENTION

1. Field of the Invention

The present invention relates to semiconductor packages and fabrication methods thereof, and more particularly, to a semiconductor package having embedded circuits and a fabrication method thereof.

2. Description of Related Art

Along with the progress of science and technologies, portable electronic products in communications, networks and computers and peripheral products are developed toward miniaturization, multi-function and high performance. Accordingly, highly integrated semiconductor processes are continuously developed, and high-density, low-cost package structures become a focus of R&D efforts.

Generally, to form a semiconductor package having embedded circuits, a plurality of recesses are formed by laser ablation on a substrate made of prepreg and then a circuit layer is formed in the recesses by electroplating.

However, the recesses must be formed one by one by the laser ablation process, which incurs a high fabrication cost. Further, in the conventional semiconductor package, electronic elements are generally mounted on surfaces of the substrate. As such, less space is available for wiring, thereby reducing the wiring flexibility.

Therefore, there is a need to provide a semiconductor package and a fabrication method thereof so as to overcome the above-described drawbacks.

SUMMARY OF THE INVENTION

In view of the above-described drawbacks, the present invention provides a method for fabricating a semiconductor package, which comprises the steps of: forming a first circuit layer on a carrier; forming a first dielectric layer on the carrier for encapsulating the first circuit layer, wherein the first dielectric layer has a first surface adjacent to the carrier and a second surface opposite to the first surface; forming a cavity penetrating the first and second surfaces of the first dielectric layer; forming at least an adhesive member in the cavity of the first dielectric layer; disposing an electronic element on the adhesive member; forming a second dielectric layer on the first dielectric layer and in the cavity to encapsulate the electronic element and the adhesive member; forming a second circuit layer on the second dielectric layer and forming a plurality of conductive vias in the second dielectric layer for electrically connecting the second circuit layer and the electronic element; and removing the carrier.

In the above-described method, the cavity can expose a portion of the carrier or the first circuit layer so as for the adhesive member to be formed thereon.

After removing the carrier, the above-described method can further comprise forming a first insulating layer on the first circuit layer and the first dielectric layer and forming a plurality of openings in the first insulating layer for exposing portions of the first circuit layer.

The above-described method can further comprise forming a second insulating layer on the second circuit layer and the second dielectric layer and forming a plurality of openings in the second insulating layer for exposing portions of the second circuit layer.

The above-described method can further comprise forming a plurality of conductive through holes penetrating the first dielectric layer and the second dielectric layer for electrically connecting the first circuit layer and the second circuit layer.

The present invention further provides a semiconductor package, which comprises: a first dielectric layer having opposite first and second surfaces and a cavity penetrating the first and second surfaces; a first circuit layer embedded in the first dielectric layer and exposed from the first surface of the first dielectric layer; at least an adhesive member formed in the cavity of the first dielectric layer and adjacent to the first surface of the first dielectric layer; an electronic element disposed on the adhesive member in the cavity of the first dielectric layer; a second dielectric layer formed on the second surface of the first dielectric layer and in the cavity of the first dielectric layer to encapsulate the adhesive member and the electronic element; a second circuit layer formed on the second dielectric layer; and a plurality of conductive vias formed in the second dielectric layer for electrically connecting the second circuit layer and the electronic element.

In the above-described package, the adhesive member can be exposed from the first surface of the first dielectric layer.

In the above-described package, the first circuit layer can further be formed at a position corresponding to the cavity of the first dielectric layer and adjacent to the first surface of the first dielectric layer so as to be embedded in and exposed from the second dielectric layer, and the adhesive member can be formed on the first circuit layer.

The above-described package can further comprise a first insulating layer formed on the first circuit layer and the first dielectric layer and having a plurality of openings for exposing portions of the first circuit layer.

The above-described package can further comprise a second insulating layer formed on the second circuit layer and the second dielectric layer and having a plurality of openings for exposing portions of the second circuit layer.

The above-described package can further comprise a plurality of conductive through holes penetrating the first dielectric layer and the second dielectric layer for electrically connecting the first circuit layer and the second circuit layer In the above-described package and method, the electronic element can be a passive component.

In the above-described package and method, the adhesive member can be made of a conductive adhesive.

In the above-described package and method, the conductive adhesive can be an anisotropic conductive adhesive.

In the above-described package and method, the adhesive member can be made of a non-conductive adhesive.

Compared with the prior art, the present invention eliminates the need to perform a laser ablation process to form recesses one by one in a substrate for forming a circuit layer, thereby reducing the fabrication cost. Further, by preventing the electronic element from being mounted on a substrate as in the prior art, the present invention increases the wiring space and flexibility.

Furthermore, the present invention facilitates to reduce the overall size of the semiconductor package.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "upper", "lower", "first", "second", "a" etc. are merely for illustrative purposes and should not be construed to limit the scope of the present invention.

First Embodiment

FIGS. 1A to 1I are schematic cross-sectional views showing a semiconductor package and a fabrication method thereof according to a first embodiment of the present invention.

Figure 1A:
FIGS. 1A to 1I are schematic cross-sectional views showing a semiconductor package and a fabrication method thereof according to a first embodiment of the present invention.

Referring to FIG. 1A, a carrier 10 is provided.

Figure 1B:
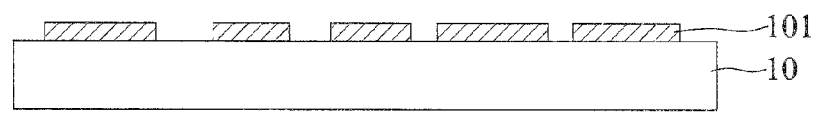

Referring to FIG. 1B, a first circuit layer 101 is formed on the carrier 10.

Figure 1C:
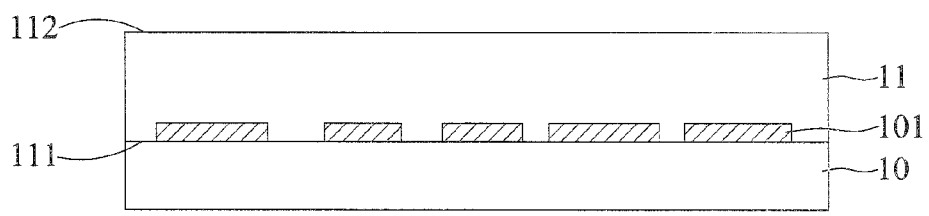

Referring to FIG. 1C, a first dielectric layer 11 is formed on the carrier 10 to encapsulate the first circuit layer 101. The first dielectric layer 11 has a first surface 111 adjacent to the carrier 10 and a second surface 112 opposite to the first surface 111. The first dielectric layer 11 can be made of prepreg.

Figure 1D:
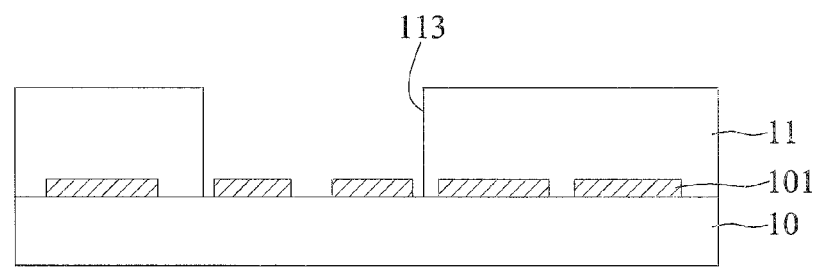

Referring to FIG. 1D, a cavity 113 is formed to penetrate the first and second surfaces 111, 112 of the dielectric layer 11 so as to expose portions of the carrier 10 and the first circuit layer 101.

Figure 1E:
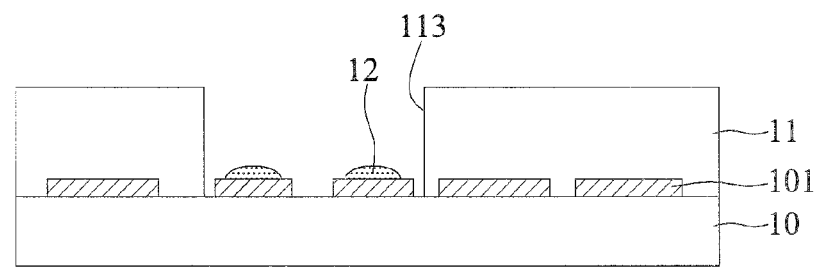

Referring to FIG. 1E, at least an adhesive member 12 is formed on the first circuit layer 101 in the cavity 113 of the first dielectric layer 11. The adhesive member 12 can be made of a conductive adhesive, for example, an anisotropic conductive adhesive.

Figure 1F:
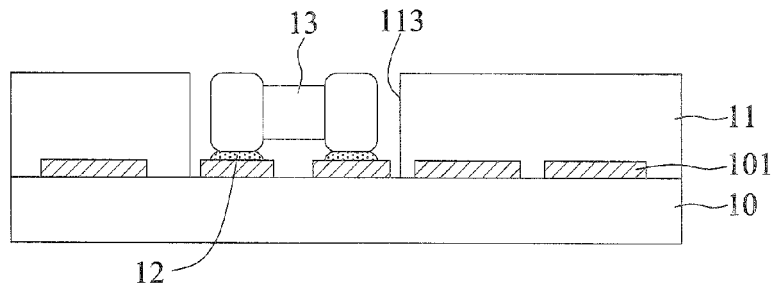

Referring to FIG. 1F, an electronic element 13 is disposed on the adhesive member 12. The electronic element 13 can be an active component, or a passive component, such as a multi-layer ceramic capacitor (MLCC).

Figure 1G:
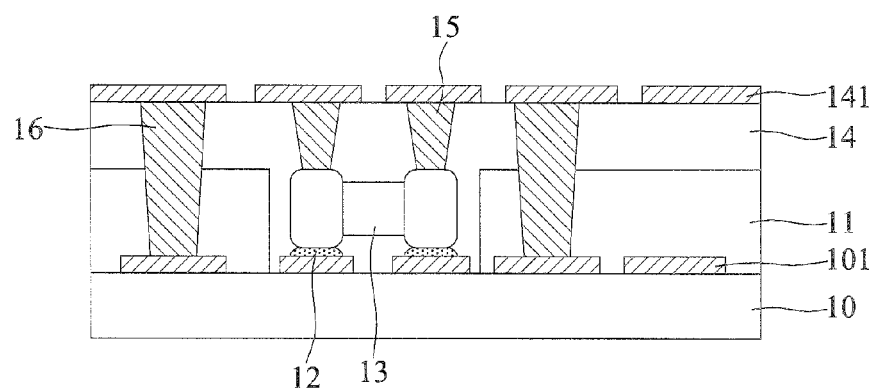

Referring to FIG. 1G, a second dielectric layer 14 is formed on the first dielectric layer 11 and in the cavity 113 to encapsulate the electronic element 13 and the adhesive member 12. The second dielectric layer 14 can be made of prepreg. Then, a second circuit layer 141 is formed on the second dielectric layer 14, and a plurality of conductive vias 15 are formed in the second dielectric layer 14 for electrically connecting the second circuit layer 141 and the electronic element 13. Further, a plurality of conductive through holes 16 are formed to penetrate the first dielectric layer 11 and the second dielectric layer 14 for electrically connecting the first circuit layer 101 and the second circuit layer 141.

Figure 1H:
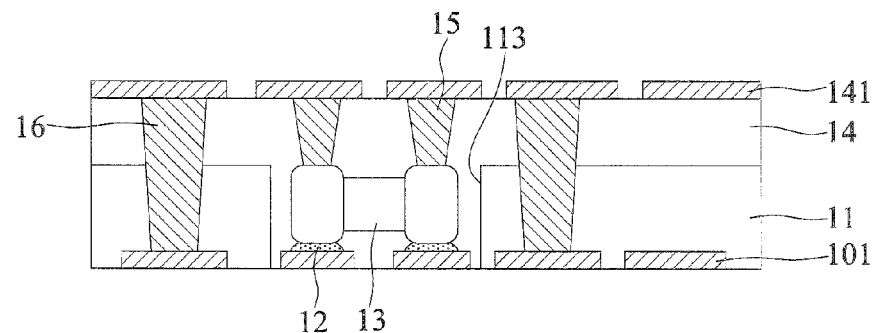

Referring to FIG. 1H, the carrier 10 is removed.

Figure 1I:
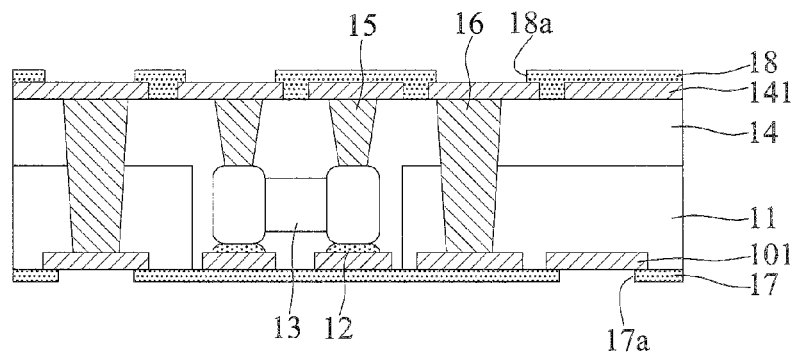

Referring to FIG. 1I, a first insulating layer 17 is formed on the first circuit layer 101 and the first dielectric layer 11 and a plurality of openings 17a are formed in the first insulating layer 17 for exposing portions of the first circuit layer 101. Further, a second insulating layer 18 is formed on the second circuit layer 141 and the second dielectric layer 14 and a plurality of openings 18a are formed in the second insulating layer 18 for exposing portions of the second circuit layer 141.

Second Embodiment

FIGS. 2A to 2I are schematic cross-sectional views showing a semiconductor package and a fabrication method thereof according to a second embodiment of the present invention.

Figure 2A:
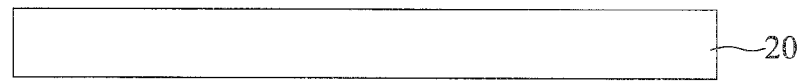
FIGS. 2A to 2I are schematic cross-sectional views showing a semiconductor package and a fabrication method thereof according to a second embodiment of the present invention.

Referring to FIG. 2A, a carrier 20 is provided.

Figure 2B:
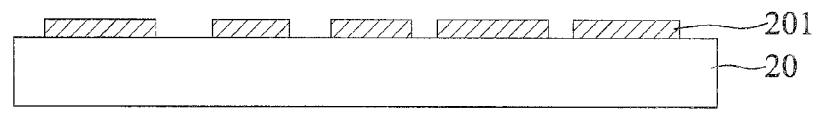

Referring to FIG. 2B, a first circuit layer 201 is formed on the carrier 20.

Figure 2C:
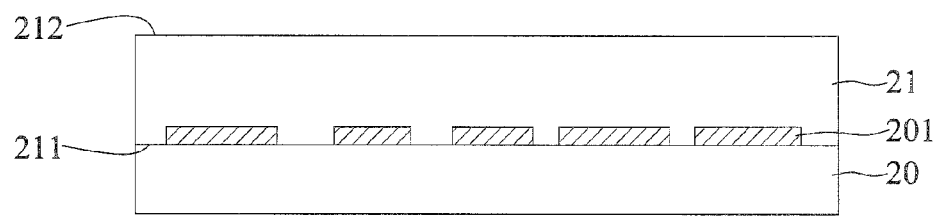

Referring to FIG. 2C, a first dielectric layer 21 is formed on the carrier 20 to encapsulate the first circuit layer 201. The first dielectric layer 21 has a first surface 211 adjacent to the carrier 20 and a second surface 212 opposite to the first surface 211.

Figure 2D:
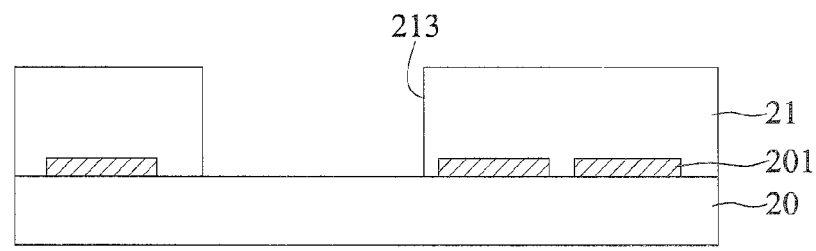

Referring to FIG. 2D, a cavity 213 is formed to penetrate the first and second surfaces 211, 212 of the dielectric layer 21 so as to expose a portion of the carrier 20.

Figure 2E:
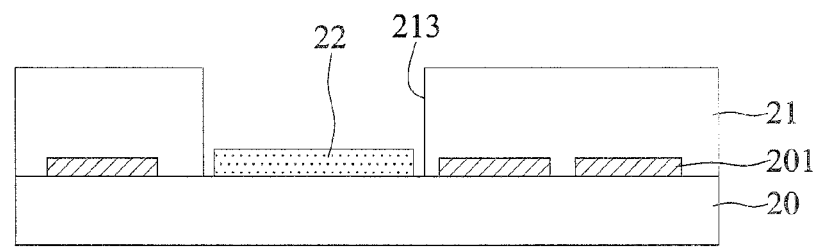

Referring to FIG. 2E, at least an adhesive member 22 is formed on the carrier 20 in the cavity 213 of the first dielectric layer 21. The adhesive member 22 can be made of a non-conductive adhesive.

Figure 2F:
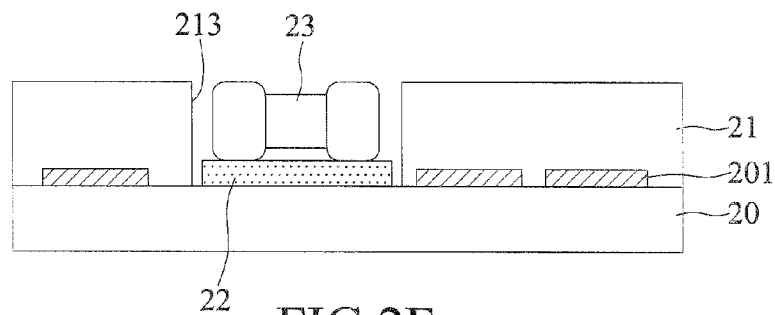
Figure 2G:
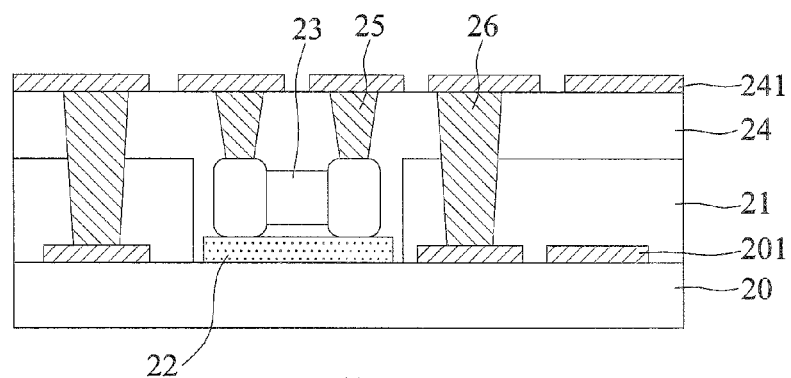

Referring to FIG. 2F, an electronic element 23 is disposed on the adhesive member 22. The electronic element 23 can be an active component, or a passive component, such as a multi-layer ceramic capacitor (MLCC).

Referring to FIG. 2O, a second dielectric layer 24 is formed on the first dielectric layer 21 and in the cavity 213 to encapsulate the electronic element 23 and the adhesive member 22. The second dielectric layer 24 can be made of prepreg. Then, a second circuit layer 241 is formed on the second dielectric layer 24, and a plurality of conductive vias 25 are formed in the second dielectric layer 24 for electrically connecting the second circuit layer 241 and the electronic element 23. Further, a plurality of conductive through holes 26 are formed to penetrate the first dielectric layer 21 and the second dielectric layer 24 for electrically connecting the first circuit layer 201 and the second circuit layer 241.

Figure 2H:
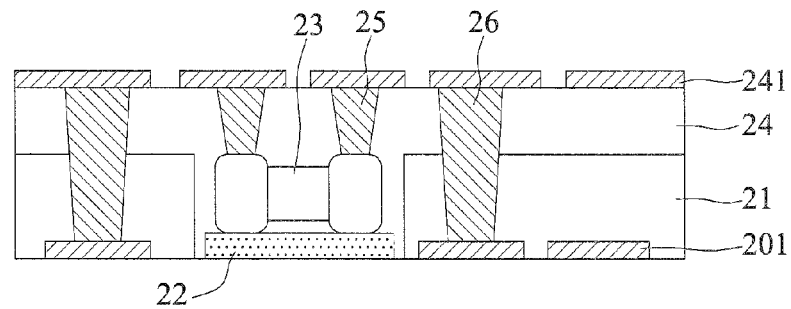

Referring to FIG. 2H, the carrier 20 is removed.

Figure 2I:
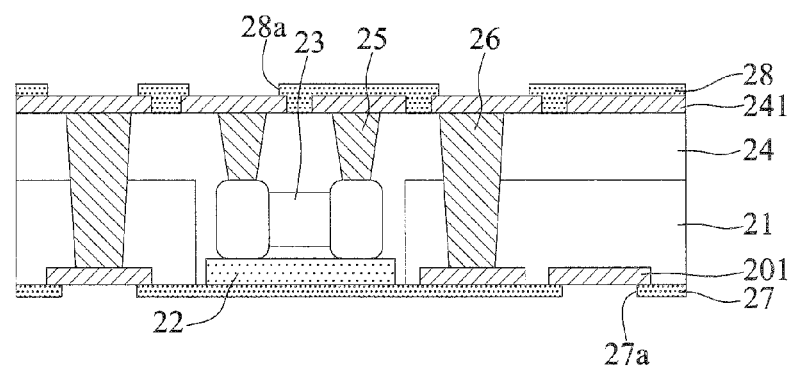

Referring to FIG. 2I, a first insulating layer 27 is formed on the first circuit layer 201 and the first dielectric layer 21 and a plurality of openings 27a are formed in the first insulating layer 27 for exposing portions of the first circuit layer 201. Further, a second insulating layer 28 is formed on the second circuit layer 241 and the second dielectric layer 24 and a plurality of openings 28a are formed in the second insulating layer 28 for exposing portions of the second circuit layer 241.

The present invention further provides a semiconductor package, which has: a first dielectric layer 11, 21 having a first surface 111, 211 and a second surface 112, 212 opposite to the first surface 111, 211 and a cavity 113, 213 penetrating the first surface 111, 211 and the second surface 112, 212; a first circuit layer 101, 201 embedded in the first dielectric layer 11, 21 and exposed from the first surface 111, 211 of the first dielectric layer 11, 21; at least an adhesive member 12, 22 formed in the cavity 113, 213 of the first dielectric layer 11, 21 and adjacent to the first surface 111, 211 of the first dielectric layer 11, 21; an electronic element 13, 23 disposed on the adhesive member 12, 22 in the cavity 113, 213 of the first dielectric layer 11, 21; a second dielectric layer 14, 24 formed on the second surface 112, 212 of the first dielectric layer 11, 21 and in the cavity 113, 213 of the first dielectric layer 11, 21 to encapsulate the adhesive member 12, 22 and the electronic element 13, 23; a second circuit layer 141, 241 formed on the second dielectric layer 14, 24; and a plurality of conductive vias 15, 25 formed in the second dielectric layer 14, 24 for electrically connecting the second circuit layer 141, 241 and the electronic element 13, 23. Further, the semiconductor package can have a plurality of conductive through holes 16, 26 penetrating the first dielectric layer 11, 21 and the second dielectric layer 14, 24 for electrically connecting the first circuit layer 101, 201 and the second circuit layer 141, 241.

Further, referring to FIG. 2H, the adhesive member 22 can be exposed from the first surface 211 of the first dielectric layer 21. Alternatively, referring to FIG. 1H, the first circuit layer 101 can further be formed at a position corresponding to the cavity 113 and adjacent to the first surface 111 of the first dielectric layer 11 so as to be embedded in and exposed from the second dielectric layer 14, and the adhesive member 12 can be formed on the first circuit layer 101.

Furthermore, a first insulating layer 17, 27 can be formed on the first circuit layer 101, 201 and the first dielectric layer 11, 21 and a plurality of openings 17a, 27a can be formed in the first insulating layer 17, 27 for exposing portions of the first circuit layer 101, 201. A second insulating layer 18, 28 can be formed on the second circuit layer 141, 241 and the second dielectric layer 14, 24 and a plurality of openings 18a, 28a can be formed in the second insulating layer 18, 28 for exposing portions of the second circuit layer 141, 241.

The electronic element 13, 23 can be a passive component, such as a multi-layer ceramic capacitor (MLCC). The adhesive member 12 can be made of a conductive adhesive, for example, an anisotropic conductive adhesive, as shown in FIG. 1H. Alternatively, the adhesive member 22 can be made of a non-conductive adhesive, as shown in FIG. 2H.

Since the present invention can form embedded circuits without the need of laser ablation, the fabrication cost is effectively reduced. Further, by embedding the electronic element in the dielectric layer, the present invention facilitates to reduce the overall size of the semiconductor package and increase the wiring space and flexibility.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating a semiconductor package, comprising the steps of:
   forming a first circuit layer on a carrier;
   forming a first dielectric layer on the carrier for encapsulating the first circuit layer, wherein the first dielectric layer has a first surface adjacent to the carrier and a second surface opposite to the first surface;
   forming in the first dielectric layer a cavity penetrating the first and second surfaces of the first dielectric layer;
   forming at least an adhesive member in the cavity of the first dielectric layer;
   disposing an electronic element on the adhesive member;
   forming a second dielectric layer on the first dielectric layer and in the cavity to encapsulate the electronic element and the adhesive member;
   forming a second circuit layer on the second dielectric layer and forming a plurality of conductive vias in the second dielectric layer for electrically connecting the second circuit layer and the electronic element; and
   removing the carrier.

2. The method of claim 1, wherein the cavity exposes a portion of the carrier or the first circuit layer so as for the adhesive member to be formed thereon.

3. The method of claim 1, after removing the carrier, further comprising forming a first insulating layer on the first circuit layer and the first dielectric layer and forming a plurality of openings in the first insulating layer for exposing portions of the first circuit layer.

4. The method of claim 1, further comprising forming a second insulating layer on the second circuit layer and the second dielectric layer and forming a plurality of openings in the second insulating layer for exposing portions of the second circuit layer.

5. The method of claim 1, wherein the electronic element is a passive component.

6. The method of claim 1, wherein the adhesive member is made of a conductive adhesive.

7. The method of claim 6, wherein the conductive adhesive is an anisotropic conductive adhesive.

8. The method of claim 1, wherein the adhesive member is made of a non-conductive adhesive.

9. The method of claim 1, further comprising forming a plurality of conductive through holes penetrating the first dielectric layer and the second dielectric layer for electrically connecting the first circuit layer and the second circuit layer.

10. A semiconductor package, comprising:
    a first dielectric layer having opposite first and second surfaces and a cavity penetrating the first and second surfaces;
    a first circuit layer embedded in the first dielectric layer and exposed from the first surface of the first dielectric layer;
    at least an adhesive member formed in the cavity of the first dielectric layer and adjacent to the first surface of the first dielectric layer;
    an electronic element disposed on the adhesive member in the cavity of the first dielectric layer;
    a second dielectric layer formed on the second surface of the first dielectric layer and in the cavity of the first dielectric layer to encapsulate the adhesive member and the electronic element;
    a second circuit layer formed on the second dielectric layer; and
    a plurality of conductive vias formed in the second dielectric layer for electrically connecting the second circuit layer and the electronic element.

11. The package of claim 10, wherein the adhesive member is exposed from the first surface of the first dielectric layer.

12. The package of claim 10, wherein the first circuit layer is further formed at a position corresponding to the cavity of the first dielectric layer and adjacent to the first surface of the first dielectric layer so as to be embedded in and exposed from the second dielectric layer, and the adhesive member is formed on the first circuit layer.

13. The package of claim 10, further comprising a first insulating layer formed on the first circuit layer and the first dielectric layer and having a plurality of openings for exposing portions of the first circuit layer.

14. The package of claim 10, further comprising a second insulating layer formed on the second circuit layer and the second dielectric layer and having a plurality of openings for exposing portions of the second circuit layer.

15. The package of claim 10, wherein the electronic element is a passive component.

16. The package of claim 10, wherein the adhesive member is made of a conductive adhesive.

17. The package of claim 16, wherein the conductive adhesive is an anisotropic conductive adhesive.

18. The package of claim 10, wherein the adhesive member is made of a non-conductive adhesive.

19. The package of claim 10, further comprising a plurality of conductive through holes penetrating the first dielectric layer and the second dielectric layer for electrically connecting the first circuit layer and the second circuit layer.

* * * * *